US006285419B1

United States Patent
Inoue et al.

(10) Patent No.: US 6,285,419 B1
(45) Date of Patent: Sep. 4, 2001

(54) TWO-TERMINAL METAL/INSULATING MATERIAL/METAL (MIM) DEVICE, METHOD FOR MANUFACTURING THE SAME AND LIQUID CRYSTAL DISPLAY PANEL

(75) Inventors: Takashi Inoue, Kariya; Yasushi Takano, Minowa-machi; Takeyoshi Ushiki, Shiojiri; Takumi Seki, Misato-mura, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/194,115

(22) Filed: Nov. 23, 1998

Related U.S. Application Data

(62) Continuation-in-part of application No. 08/936,545, filed on Sep. 24, 1997, now Pat. No. 5,994,748, which is a continuation-in-part of application No. 08/750,042, filed as application No. PCT/JP96/00903 on Apr. 1, 1996, now Pat. No. 5,867,234.

(30) Foreign Application Priority Data

Mar. 31, 1995 (JP) .................................................... 7-100371
Mar. 25, 1997 (JP) .................................................... 9-090312
Mar. 25, 1997 (JP) .................................................... 9-090313

(51) Int. Cl.[7] ......................... G02F 1/136; C23C 28/00; H01L 29/78
(52) U.S. Cl. ................................. 349/52; 257/30; 438/957
(58) Field of Search ............................. 349/51, 52, 49; 257/2, 9, 30; 438/957

(56) References Cited

U.S. PATENT DOCUMENTS 5,867,234 * 2/1999 Takano et al. ........................ 349/52
5,994,748 * 11/1999 Inoue et al. ......................... 257/410

FOREIGN PATENT DOCUMENTS

| 3-259225 | 11/1991 | (JP) . |
| 6-308539 | 11/1994 | (JP) . |
| 7-104318 | 4/1995 | (JP) . |
| 96-00903 * | 3/1996 | (JP) . |
| 8-262500 | 10/1996 | (JP) . |
| 8-330647 | 12/1996 | (JP) . |
| 10-247754 | 9/1998 | (JP) . |
| WO96/30953 | 10/1996 | (WO) . |

* cited by examiner

Primary Examiner—Kenneth Parker
(74) Attorney, Agent, or Firm—Oliff & Berridge, PLC.

(57) ABSTRACT

An MIM nonlinear device having a large nonlinearity coefficient that represents the sharpness of the voltage-current characteristic, a liquid crystal display panel with high image-quality that uses this device, and a manufacturing method of said MIM nonlinear device are provided. The MIM nonlinear device contains a first conductive film 22, an insulating film 24, and a second conductive film 26 laminated on a substrate 30. The insulating film 24 may contain water, and in the insulating film, in a thermal desorption spectrum, a peak derived from water in the insulating film is 225–300° C. Further, in said thermal desorption spectrum, the number of molecules calculated from the area of the peak derived from the water is preferably $5 \times 10^{14}/cm^2$ or more.

11 Claims, 15 Drawing Sheets

TWO-TERMINAL METAL/INSULATING MATERIAL/METAL (MIM) DEVICE, METHOD FOR MANUFACTURING THE SAME AND LIQUID CRYSTAL DISPLAY PANEL

This is a Continuation-in-Part of application Ser. No. 08/936,545, filed Sep. 24, 1997, now U.S. Pat. No. 5,994,748, which is a Continuation-in-Part of application Ser. No. 08/750,042, filed Nov. 29, 1996, now U.S. Pat. No. 5,867,234, which is a U.S. National Stage application of PCT/JP96/00903, filed Apr. 1, 1996.

BACKGROUND OF THE INVENTION

1. Field of the Invention

The present invention relates to a highly reliable two-terminal nonlinear device used as a switching device where the sharpness of the voltage-current characteristic is sufficiently large and change of the voltage-current characteristic is small, a method for manufacturing the two-terminal nonlinear device, and a liquid-crystal display panel having high image quality without display irregularity or sticking and with high contrast that uses the two-terminal nonlinear device.

2. Description of Related Art

In an active matrix-type liquid-crystal display device, liquid crystal is filled between an active-matrix substrate which forms a matrix array by disposing a switching device for each pixel area and an opposing substrate in which a color filter is disposed, for example. Alignment of the liquid crystal for each pixel area is controlled to display desired image information. In general, a three-terminal device such as a thin film transistor (TFT) or a two-terminal device such as metal/insulating material/metal (MIM) nonlinear devices is used as a switching device. A two-terminal device used as a switching device is more advantageous than a three-terminal device since two-terminal devices are free of cross-over shorting and can be manufactured by a simpler process.

Japanese Patent Laid-Open Publication No. Sho 63-50081 discloses a technique for improving nonlinearity of a MIM nonlinear device. In this technique, a tantalum film is subjected to anodic oxidation and heat-treated at a temperature of 400°–600° C., to improve the nonlinearity, particularly, the sharpness of the voltage-current characteristic. However, sufficient nonlinearity has not been obtained even by this technique.

SUMMARY OF THE INVENTION

Therefore, an objective of the present invention is to provide a two-terminal nonlinear device with high reliability having a sharp voltage-current characteristic and a small change of the voltage-current characteristic, and a liquid crystal display panel that uses the two-terminal type nonlinear device with high image quality without image irregularity and sticking, and with high contrast.

Furthermore, another objective of the present invention is to provide a method for manufacturing a two-terminal nonlinear device having the above-desirable characteristics.

The two-terminal nonlinear device (hereafter referred to as "MIM nonlinear device") according to the present invention has characteristics such that water is included in an insulating film in a two-terminal nonlinear device that includes a first conductive film, the insulating film, and a second conductive film which are laminated on a substrate. In the insulating film, in the thermal desorption spectrum, the peak derived from the water of the insulating film is in a range of 225–300° C.

Furthermore, the MIM nonlinear device according to the present invention is not limited to a metal second conductive film, and may include an ITO (Indium Tin Oxide) conductive film.

By including water in the insulating film of the MIM nonlinear device according to the present invention, the nonlinearity coefficient ($\beta$ value) that represents the sharpness of the voltage-current characteristic is significantly improved.

In the present invention, with respect to the thermal desorption spectrum, the number of molecules which is calculated from the area of the peak derived from the water of the insulating film is preferably $5 \times 10^{14}/cm^2$ or greater, and more preferably is $1.0 \times 10^{15} - 5.0 \times 10^{15}/cm^2$. Furthermore, the number of water molecules contained in the insulating film shows the average value in the film thickness direction of the insulating film. In addition, by a secondary-ion mass-spectrometry (SIMS) elemental analysis with the irradiation of cesium primary ions, the intensity of the hydrogen spectrum of water preferably changes one peak or more near the insulating film. Furthermore, in the present invention, the hydrogen spectrum of water in the insulating film obtained by SIMS exhibits at least one peak preferably in the vicinity of the surface of the second conductive film of the insulating film, more preferably, within a range from the surface to 30 mn deep.

The first conductive film is preferably tantalum or a tantalum alloy. Further, the insulating film is preferably formed by anodic oxidation of the first conductive film.

The manufacturing method of the MIM nonlinear device according to the present invention includes (a) a step of forming a first conductive film on a substrate, (b) a step of forming an insulating film on a surface of the first conductive film by anodic oxidation of the first conductive film using a electrolyte of ethylene glycol including water at a ratio of 1–10% by weight as a solvent, (c) a step of including water in at least the insulating film by performing a first heat treatment of the substrate on which the first conductive film and the insulating film are formed in an atmosphere including water vapor, and (d) a step of forming a second conductive film on the insulating film.

According to this manufacturing method, a MIM nonlinear device according to the present invention as described above can be obtained by employing a simple heat treatment. Further, in this manufacturing method, water may be incorporated into the insulating film by the first heat treatment step (c). In addition, in the step (b) of forming the insulating film using ethylene glycol including a specified amount of water as a solution, it is possible to reliably incorporate water into the insulating film.

In the first heat treatment step, the concentration or density of water vapor relative to the entire treatment gas is preferably 0.001 mol % or more, and more preferably 0.014–2 mol %. Preferably, this first heat treatment (annealing step A) is performed as a temperature-descending step continuously after a second heat treatment (annealing step B) in which the substrate provided with the first conductive film and the insulating film is heat-treated in an inert gas. Also, it is preferable that the second heat treatment is performed within a range of 320–380° C.

It is considered that the insulating film of the MIM nonlinear device has a structure of joined insulating materials having different energy levels of their conductive segments. As a result, when a low voltage is applied to the MIM nonlinear device, the resistance of the device is large and the β value is also large. This will be further discussed in detail as follows.

In a MIM nonlinear device manufactured by a method including the above described annealing A, the insulating film has a structure including a first surface layer that contains water and is closer to the film surface facing the second conductive film, and a second layer that does not substantially contain water. Thus, the insulating film has the conductive segments at different energy levels. That is, the conductive segment of the first layer containing water has an energy level lower than that of the second layer without water. Therefore, when a low voltage (for example, 5V or less) is applied to the MIM nonlinear device, the resistance of the device becomes large to dissolve the energy difference between the conductive segments in the insulating film. Meanwhile, when a high voltage (for example, 10V or more) is applied to the MIM nonlinear device, resistance of the device varies little since the energy difference within the insulating film does not substantially influence the electrical conduction. Because of this, the voltage-current characteristic of the MIM nonlinear device is sharpened. At this time, the resistance value R of the device can be expressed by the following formula.

$$R = 1/\alpha \exp(\beta Vi^{1/2} - Eg/\kappa T) + Vs/\lambda \exp(qVs/\kappa T)$$

α=Electrical conductivity at room temperature when no voltage is applied to the MIM nonlinear device;
β=Sharpness of the voltage-current characteristic;
Vi=Voltage applied to the insulating film;
Eg=Activation energy;
κ=Bolzmann's constant;
T=Absolute temperature;
Vs=Voltage applied to the interface between the first layer and the second layer of the insulating film;
λ=Constant;
q=Electric charge of an electron;

In the above formula, the first term relates to the conduction of the insulating film according to the Pool-Frenkel conduction, and the second term relates to energy difference between the conductive segments in the insulating film. That is, the second term is based on regular-directional conduction to be a pn junction when the first layer is assumed to be an n-type semiconductor and the second layer is assumed to be a p-type semiconductor.

As described above, the MIM nonlinear device of the present invention has advantages such that the nonlinear coefficient (β value) is large, sharpness of the voltage-current characteristic is excellent, change of the voltage-current characteristic is small, and the reliability is high.

Furthermore, the liquid crystal display panel of the present invention includes the above-mentioned MIM nonlinear device and, more specifically, includes a transparent substrate, a signal line disposed on the substrate in accordance with a predetermined pattern, a plurality of MIM nonlinear devices of the present invention connected to the signal line, a first substrate with pixel electrodes connected to the MIM nonlinear devices, a second substrate having another signal line in a position facing the pixel electrodes, and a liquid crystal layer sealed between the first substrate and the second substrate.

According to this liquid crystal display panel, images can be displayed at a high contrast without sticking, and therefore with high quality. The liquid crystal display panel can, therefore, be used for a large variety of purposes.

DETAILED DESCRIPTION OF PREFERRED EMBODIMENTS

Figure 1:
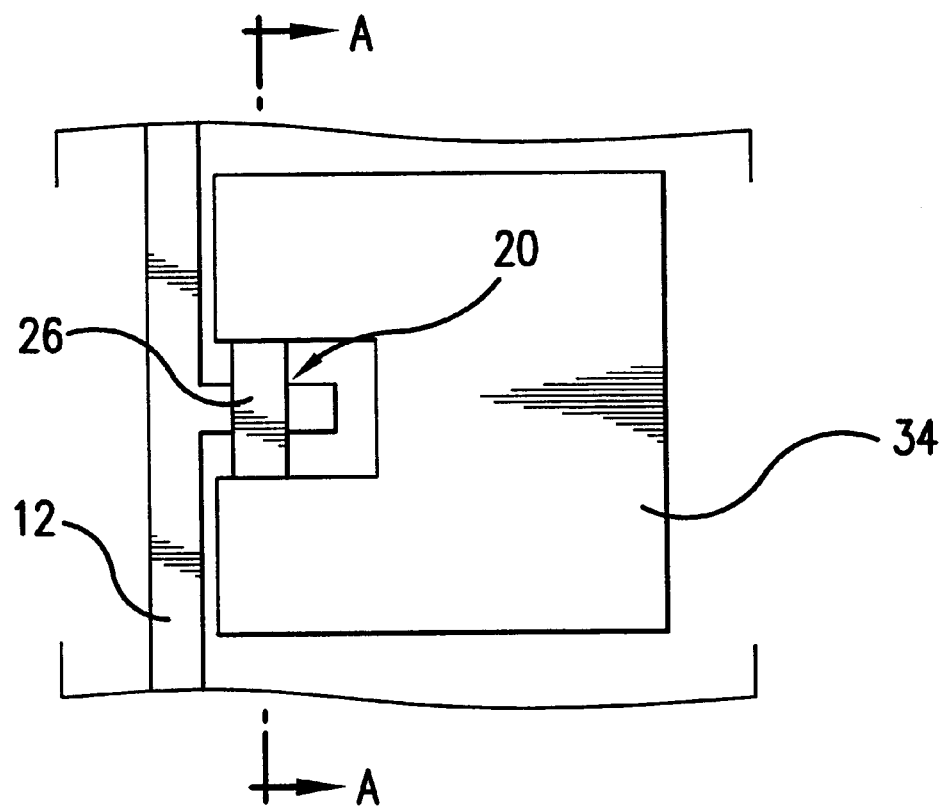
FIG. 1 is a plan view showing a liquid-crystal display panel manufactured using the MIM nonlinear device according to a first embodiment of the present invention.

Preferred embodiments of the present invention are explained by referring to the drawings as follows.

(MIM nonlinear device and liquid crystal display panel)

Figure 2:
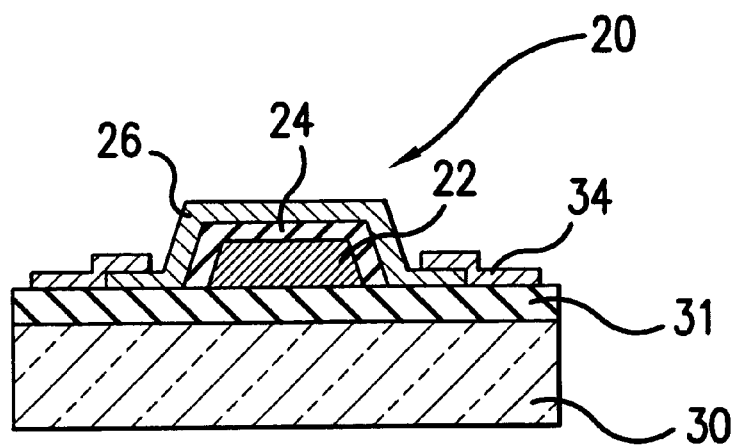
FIG. 2 is a sectional view along line A—A in FIG. 1.

FIG. 1 is a plan view showing, in exemplary form, one unit of a liquid-crystal-driving electrode formed using an MIM nonlinear device according to a first embodiment of the present invention. FIG. 2 shows, in exemplary form, the section along line A—A in FIG. 1.

The MIM nonlinear device 20 includes a substrate (first substrate) 30 having insulating properties and transparency, such as a substrate including glass, plastic or the like, an insulating film 31 formed on the surface of the substrate 30, a first conductive film 22 formed by tantalum or a tantalum alloy, an insulating film 24 formed by anodic oxidation on the surface of the first conductive film 22 and a second conductive film 26 formed on the surface of the insulating film 24. Further, the first conductive film 22 of the MIM nonlinear device 20 is connected to a signal line (scanning line or data line) 12 and the second conductive film 26 is connected to pixel electrode 34.

The insulating film 31 may include tantalum oxide. The insulating film 31 prevents the first conductive film 22 from peeling due to the heat treatment performed after the deposition of the second conductive film 26 and to prevent diffusion of impurities from the substrate 30 into the first conductive film 22, so it may not be necessary if these do not cause these problems.

The first conductive film 22 is mainly formed by a sole tantalum or may be an alloy film including a principle component of tantalum and at least one element belonging to Groups 6, 7, or 8 of the periodic table. Preferred examples of such elements to be added to an alloy include tungsten, chromium, molybdenum, rhenium, yttrium, lanthanum, and dysprosium. An especially preferred element is tungsten and a preferable content inclusion ratio is, for example, 0.1 thorough 6% atomic %.

The insulating film 24 is preferably formed by anodic oxidation in a treatment solution described below.

As a feature of the present invention, water may be contained in the insulating film 24 in the thermal desorption spectrum, the peak derived from the water contained in the insulating film 24, is in the range of 225–300° C. and more preferably in the range of 230–260° C. Moreover, the number of molecules calculated from the area of the peak derived from the water is preferably $5 \times 10^{14}/cm^2$ or more, and more preferably $1.0 \times 10^{15}$ through $5.0 \times 10^{15}/cm^2$. The measuring method of the thermal desorption spectrum will be described later.

Furthermore, in the present invention, with respect to the element analysis which is obtained by secondary ion mass spectrometry (SIMS) by the irradiation of cesium primary ions, the intensity of the hydrogen spectrum derived from water preferably changes one peak or more in the insulating film 24. Moreover, with respect to the hydrogen spectrum derived from the water of the insulating film 24 in the element analysis which is obtained by SIMS, it is preferable that at least one peak in the insulating film 24 exists in the vicinity of the surface of the second conductive film 26 and more preferably in the range of 30 mn deep.

Thus, the nonlinear coefficient that shows the sharpness of the voltage-current characteristic may be significantly improved by including water in the surface of the insulating film 24 as will be discussed later.

Although the material of the second conductive film 26 is not especially limited, chromium is ordinarily used. Further, the pixel electrode 34 may include a transparent conductive film such as an ITO film.

Figure 3:
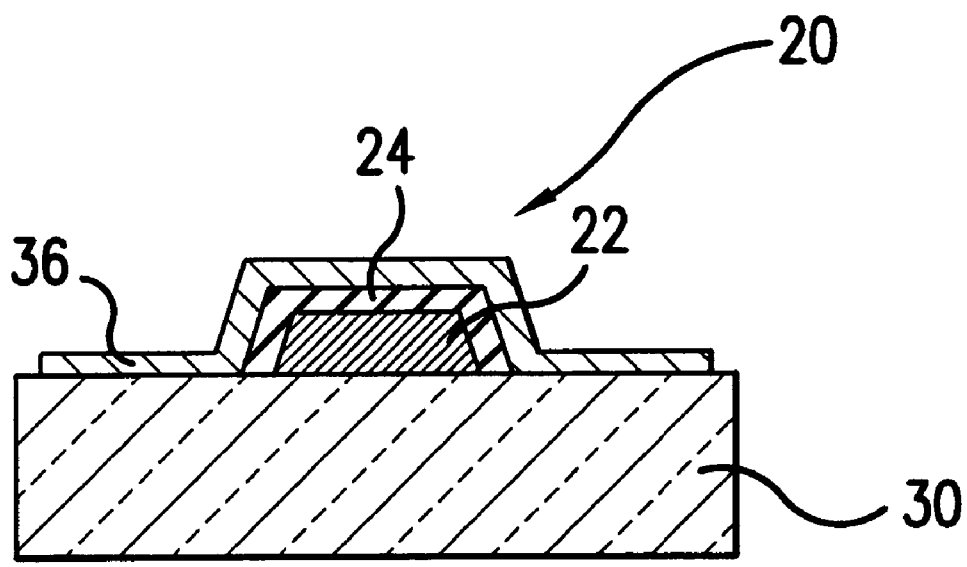
FIG. 3 is a sectional view showing another structural example of the MIM nonlinear device according to the present invention.

Moreover, as shown in FIG. 3, the second conductive film and the pixel electrode may be integrated within one transparent conductive film 36. If the second conductive film and the pixel electrode are formed with one film, the number of steps for forming the film can be reduced.

Figure 4:
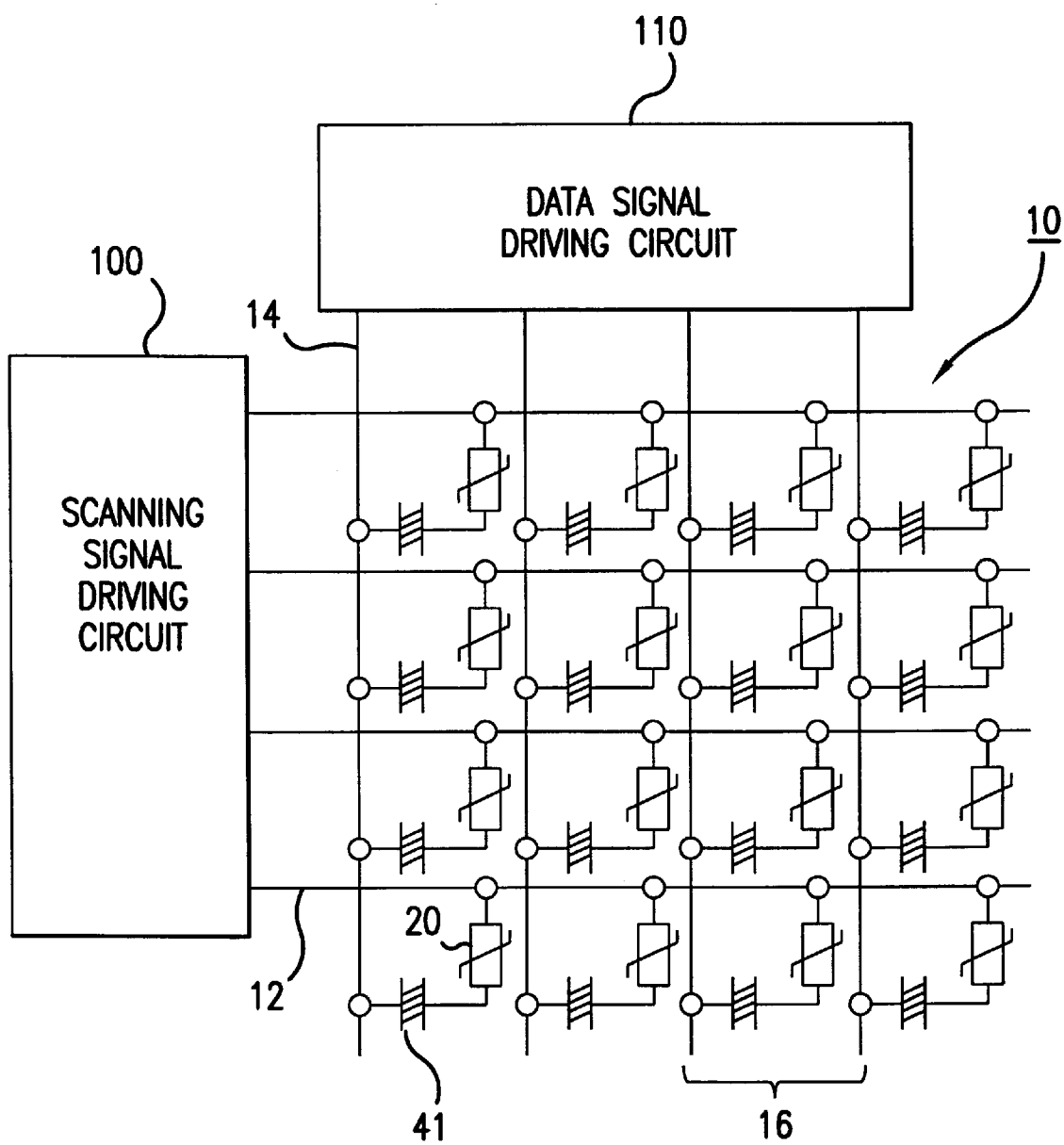
FIG. 4 is a diagram showing an equivalent circuit of a liquid-crystal panel according to the present invention.

FIG. 4 shows one example of an equivalent circuit of an active-matrix liquid-crystal display panel including the MIM nonlinear device 20. The liquid-crystal display panel 10 includes a scanning signal driving circuit 100 and a data signal driving circuit 10. The liquid-crystal display panel 10 is provided with a plurality of scanning lines 12 and a plurality of data lines 14. The scanning lines 12 are driven by the scanning signal driving circuit 100 and the data lines 14 are driven by the data signal driving circuit 110. Furthermore, in each pixel area 16, the MIM nonlinear device 20 and the liquid-crystal-displaying elements (liquid crystal layer) 40 are connected in series between a scanning line 12 and a data line 14. In FIG. 4, the MIM nonlinear devices 20 are connected to the scanning lines 12 while the liquid-crystal-displaying elements 41 are connected to the data lines 14 however, on the other hand, it is also acceptable to have a structure where the liquid crystal display devices 41 are connected to the scanning lines 12 and the MIM nonlinear devices 20 are connected to data lines 14.

Figure 5:
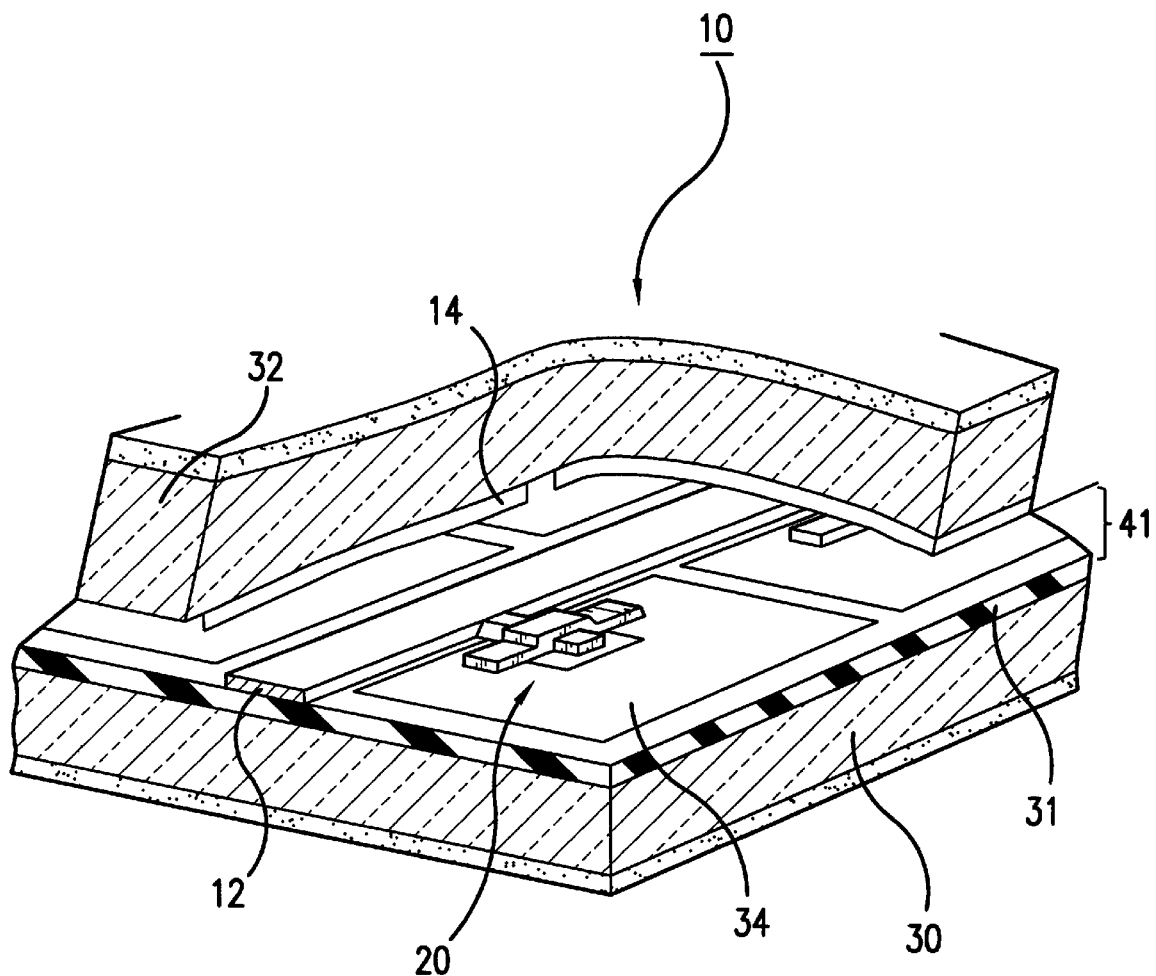
FIG. 5 is a perspective view showing a liquid-crystal panel according to the present invention.

FIG. 5 is a perspective figure showing one example of a liquid-crystal display panel according to an embodiment of the present invention. The liquid-crystal display panel 10 includes two substrates, namely, a first substrate 30 and a second substrate 32 disposed oppositely. Liquid crystal is sealed between these substrates 30 and 32, and a liquid-crystal displaying element (liquid crystal layer) 41 is formed. An insulating film 31 is formed on the first substrate 30 as described above. A plurality signal lines (scanning lines) 12 are formed on the insulating film 31. Further, the second substrate 32 is provided with a plurality of strip-shaped data lines 14 crossing the scanning lines 12. In addition, pixel electrodes 34 are connected to the scanning lines 12 through the MIM nonlinear devices 20.

The display operation is controlled by switching the liquid-crystal-displaying elements 41 into a displaying state, a non-displaying state, or an intermediate state based upon signals applied to the scanning lines 12 and data lines 14. An ordinary controlling method can be employed for the display operation.

Figure 6:
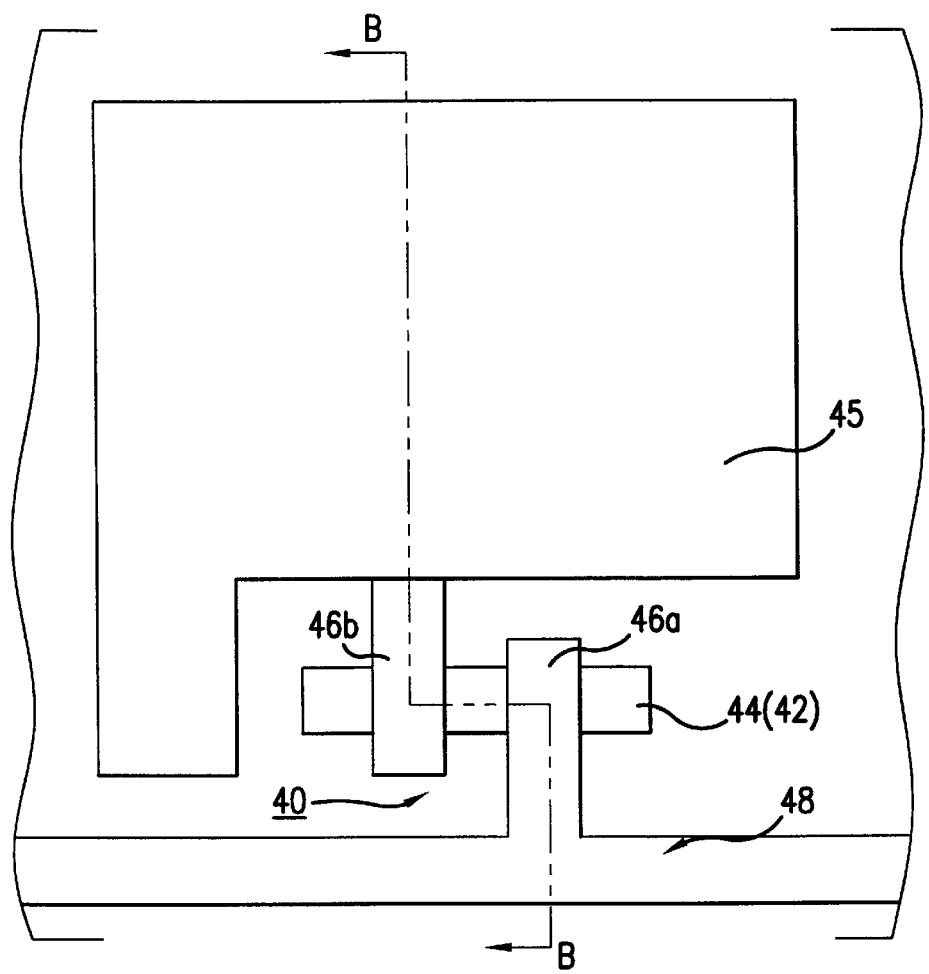
FIG. 6 is a view showing the liquid-crystal display panel manufactured using the MIM nonlinear device saving a back-to-back structure according to a second embodiment of the present invention.
Figure 7:
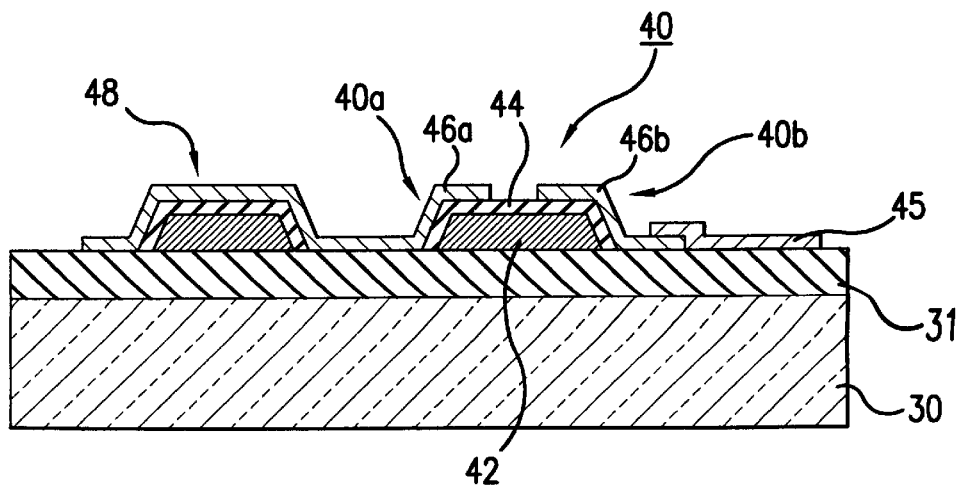
FIG. 7 is a sectional view along the line B—B in FIG. 6.

FIGS. 6 and 7 show a second embodiment of the MIM nonlinear device. FIG. 6 shows one unit of the liquid-crystal-driving electrode including the MIM nonlinear device of this embodiment and FIG. 7 shows the section across line B—B in FIG. 6.

This MIM nonlinear device 40 is different from the above-mentioned MIM nonlinear device 20 in having a back-to-back structure. That is, the MIM nonlinear device 40 has a structure in which a first MIM nonlinear device 40a and a second MIM nonlinear device 40b are connected in series with mutually reverse polarities.

More specifically, this is formed from a substrate having insulating properties and transparency. For example, substrate (first substrate) 30 may be formed by glass, plastic, or the like, an insulating film 31 may be formed on the surface of the substrate 30, a first conductive film 42 may be formed by tantalum or a tantalum alloy, an insulating film 44 may be formed by anodic oxidation on the surface of the first conductive film 42, and two second conductive films 46a and 46b may be mutually separated and formed on the surface of the insulating film 44. Further, the second conductive film 46a of the first MIM nonlinear device 40a is connected to a signal line (scanning line or date line) 48 and the second conductive film 46b of the second MIM nonlinear device 40*b* is connected to a pixel electrode 45. In addition, the film thickness of the insulating film 44 is thinner compared to the insulating film 24 of the cross-shaped MIM nonlinear device 20 shown in FIGS. 1 and 2. For example, it is formed at approximately one half of the size. Other properties, the structure and the like of each component such as the first conductive film 42, the insulating film 44 and the second conductive films 46*a* and 46*b* are the same in the MIM nonlinear device 20 and as such their description is omitted.

Such a MIM nonlinear device having a back-to-back structure exhibits superior symmetry in the voltage-current characteristics compared to the above-described cross-shaped MIM nonlinear device shown in FIGS. 1 and 2. Exhibiting good symmetry in the voltage-current characteristic means having a sufficiently small difference between the absolute value of a current flowing from a data line to a pixel electrode at a certain voltage and that of current flowing from a pixel electrode to the data line.

(Manufacturing process of the MIM nonlinear device)

A manufacturing method of the MIM nonlinear device 20 shown in FIGS. 1 and 2 will now be described.

The MIM nonlinear device 20 is manufactured by the following process, for example.

(a) Initially, the insulating film 31 made from tantalum oxide is formed on the substrate 30. The insulating film 31 can be formed by a method in which a tantalum film is deposited by sputtering and heat oxidized, or by sputtering or co-sputtering using a target including tantalum oxide. The insulating film 31 improves the adhesion of the first conductive film 22 and prevents impurity diffusion from the substrate 30 so it can be formed with a film thickness of approximately 5–200 nm, for example.

Next, the first conductive film 22 formed by tantalum or a tantalum alloy is formed on the insulating film 31. The film thickness of the first conductive film is selected depending on the use of the MIM nonlinear device. Usually this is approximately 10–500 nm. The first conductive film can be formed by sputtering or electron beam deposition. Sputtering, which uses a mixing target, co-sputtering, or electron beam depositing can be used for forming the first conductive film including a tantalum alloy. Elements belonging to the Groups 6, 7 or 8 of the periodic table, and preferably, tungsten, chromium, molybdenum, and rhemium can be selected as an element in the tantalum alloy.

The first conductive film 22 may be patterned according to ordinary photolithographic and etching techniques. Further, the signal lines (scanning lines or data lines) 12 are formed according to the same steps as those for forming the first conductive film 22.

(b) Next, for example, an insulating film 24 is formed by anodic oxidizing the surface of the first conductive film 22. At this time, the surface of each signal line 12 is also oxidized to form the insulating film. The film thickness of the insulating film 24 is selected depending on its use, and may be approximately 20–70 mn.

The electrolyte used for anodic oxidation includes ethylene glycol as a solvent, and further includes water at a ratio of 1–10% by weight, and more preferably at a ratio of 3–7% by weight. As a solution, an aromatic carboxylate, for example, salicylate and phathalate, is preferable. As aromatic carboxylate, for example, ammonium salicylate, ammonium benzoate, γ-ammonium resorcylate, ammonium hydrogen phathalate, diammonium phathalate, or the like can be used.

The pH measured by a pH meter in the electrolyte is preferably 8–13, and more preferably 9–12. When the pH of the electrolyte is 13 or more, the oxidation film can be easily peeled, and when the pH is 8 or less, forming a uniform oxidation film may be difficult because the electrical conductivity of the electrolytic solution is too small. Furthermore, the solution concentration can be determined by the electrical conductivity of the electrolyte the amount of the solution added to the anodic oxidation film, the pH or the like. For example, the solution concentration is preferably 1–30% by weight, and more preferably 1–10% by weight.

Anodic oxidation is performed in a temperature range where the electrolyte stably exists as liquid such as –20–150° C., and more preferably at room temperature through 100° C. Furthermore, the method of controlling the current and voltage during anodic oxidation is not particularly limited, but it is normally performed by constant current up to predetermined electrolytsis voltage (Vf), where it is held for a certain period of time after it reaches the voltage (Vf). At this time, the current density is preferably 0.001–10 mA/cm$^2$, and more preferably, 0.01–1 mA/cm$^2$. In addition, the electrolysis voltage Vf depends on the design of the driving circuit when a liquid crystal display panel is manufactured, but it is normally 5–100V, and preferably 1–40V.

Figure 8:
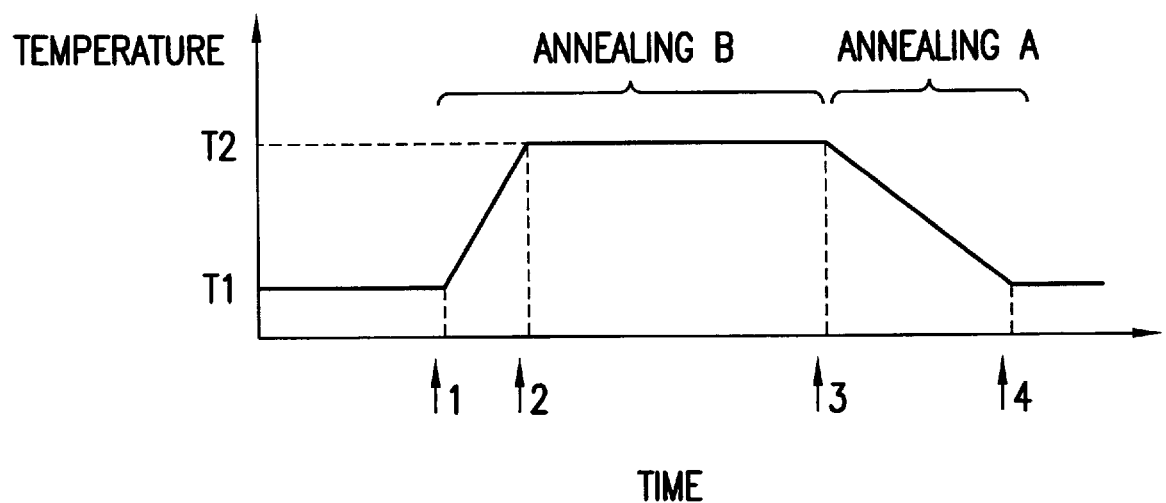
FIG. 8 is a diagram showing the relationship between time and temperature for the heat treatment in a manufacturing method according to the present invention.

(c) Next, an annealing step including heat treatment for introducing water into the insulating film 24 will be described. FIG. 8 shows an example of the relationship between the treating time period and the temperature in the annealing step. The annealing step of this example includes annealing B, which principally comprises a step performed at a constant temperature (T2), and annealing A, which includes a temperature-descending step.

Annealing B includes a temperature-ascending step time period from t1 to t2 and a constant temperature step performed in a time period from t2 to t3. Annealing B is performed in an atmosphere of an inert gas such as a rare gas as argon or nitrogen gas at the temperature T2 of 300° C. or higher, and preferably, 320–380° C. The time period for the constant-temperature heat-treatment (from t2 to t3) is varied depending on the thickness of the first conductive film, the heat capacity of the annealing furnace, the number of wafers to be processed, the thickness of the substrate glass in the wafer, the set temperature, and the like. For example, approximately 1–120 minutes may be required.

Annealing A is performed in an atmosphere containing water vapor so as to decrease the temperature from T2 to T1. The temperature T1 is preferably 220° C. or less, and more preferably, 200° C. or less for sufficient absorption of water vapor into the insulating film 24. The time period for annealing A (t3 to t4) is preferably 10 seconds or longer, more preferably two minutes or longer, and furthermore is preferably 5–300 minutes.

Further, in the temperature-descending step of annealing A, the temperature-descending rate is preferably 0.1° C./minute-60° C./minute, more preferably is 0.5° C./minute-40° C./minute, and furthermore preferably is 0.5° C./minute-10° C./minute. Further, during the temperature-descending step, the temperature may be maintained at a constant value for a while or may be slightly raised for a while. The above-described temperature-descending rate is an average of cases like this.

In annealing A, at least one kind of gas selected from air and inert gases such as rare gases like argon or nitrogen gas is used as the gas containing water vapor. The concentration of the water vapor is preferably 0.001 mol % or more and is more preferably 0.014–2 mol % relative to the entire gas containing water vapor.

According to heat treatment containing such annealing A, water can be incorporated into the insulating film 24.

(d) The second conductive film 26 is formed by depositing a metal film such as chromium, aluminum, titanium, or molybdenum according to sputtering, for example. The second conductive film 26 is formed to a thickness of 50–300 nm, for example, and then is patterned by ordinary photolithographic and etching techniques. Next, an ITO film is deposited by sputtering or the like to a thickness of 32–100 nm and pixel electrodes 34 in accordance with a predetermined pattern are formed by ordinary lithographic and etching techniques.

In these steps, namely, the steps for sputtering the ITO film constituting the second conductive film 26 and the pixel electrodes 34, it is preferable that formation of the films is carried out at a temperature less than 200° C. in order to prevent desorption of water that has been introduced into the insulating film 24 in the step (c). If formation of the films is carried out at a temperature of 200° C. or greater, the substrate temperature should preferably be made uniform so that water is contained as equally as possible in regions of the same depth in the insulating film 24.

Further, in the MIM nonlinear device 20 shown in FIG. 3, the second conductive film and the pixel electrode are formed with a common transparent conductive film 36 including the ITO film or the like. In this case, because the second conductive film and the pixel electrode are formed by the same process, the manufacturing processing can be simplified. The manufacturing processing of the MIM nonlinear device shown in FIGS. 6 and 7 is basically the same as that for the MIM nonlinear device shown in FIGS. 1 and 2 although the patterns achieved by patterning is different.

The following explains details using specific examples and comparative examples of the present invention.

EXAMPLE 1

In the MIM nonlinear device of this example, the back-to-back structure shown in FIGS. 6 and 7 is used. Specifically, a tantalum film (containing 0.2 atomic % of tungsten) having a thickness of 150 nm was deposited on a glass substrate by sputtering and patterned to form a first conductive film. Next, constant-current electrolysis was performed at a current density of 0.04 mA/cm$^2$ by using an ethylene glycol solution containing 6.5% by weight of water and 10% by weight of ammonium salicylate as a electrolyte until the voltage reached 15V. After that, anodic oxidation of the tantalum film was performed by constant-voltage electrolysis at a voltage of 15V for approximately 2 hours. As a result, a tantalum oxide film (insulating film) was formed to a thickness of approximately 25 nm.

Next, chromium was deposited on the insulating film by sputtering to a film thickness of 100 nm and patterned to form the second conductive film thus manufacturing the MIM nonlinear device of Example 1.

EXAMPLE 2

In this example, just like Example 1, the MIM nonlinear device was formed as in Example 1 such that after the first conductive film, the insulating film were formed on the glass substrate, other than performing the following heat treatment.

That is, first, heat treatment (annealing B shown in FIG. 8) was performed in nitrogen for 30 minutes at 320° C. After that, the nitrogen atmosphere was replaced with air (containing 1.2 mol % of water vapor), cooled for 120 minutes until it reached 200° C. at a temperature-descending rate of 1° C./minute in this atmosphere, and the heat treatment (annealing A shown in FIG. 8) was performed.

After that, as in Example 1, chromium was deposited on the insulating film by sputtering to a film thickness of 100 nm and was patterned to form the second conductive film thus manufacturing the MIM nonlinear device. Furthermore, conditions of annealing A are shown in Table 1. In Table 1, the temperature of the annealing conditions shows the initial temperature for annealing A (the temperature of the constant temperature of annealing B) (T2 in FIG. 8).

PRACTICAL EXAMPLE 3

These MIM nonlinear devices were manufactured in a manner similar to Example 2 except that the heat treatment (annealing conditions) was performed under the conditions shown in Table 1 instead of the annealing conditions in Example 2. That is, in Example 3, the annealing temperature T2 was 410° C., and the amount of water vapor was 1.2 mol %.

COMPARATIVE EXAMPLE 1

In Comparative Example 1, a citric acid solution of 0.05% by weight was used as the electrolyte for anodic oxidation and constant current electrolysis was performed at a current density of 0.04 mA/cm$^2$ until it reached a voltage of 15V, and anodic oxidation of the tantalum film was performed. Other than that, the MIM nonlinear device was formed as for Example 1. Furthermore, in Comparative Example 1, the annealing processing was not performed.

EXPERIMENTAL EXAMPLE

Next, experimental examples related to the MIM nonlinear device of Examples 1–3 and Comparative Example 1 will be described. The experiment results are shown in Table 1.

(a) Thermal Desorption Spectrum

EXAMPLE 1

Figure 9:
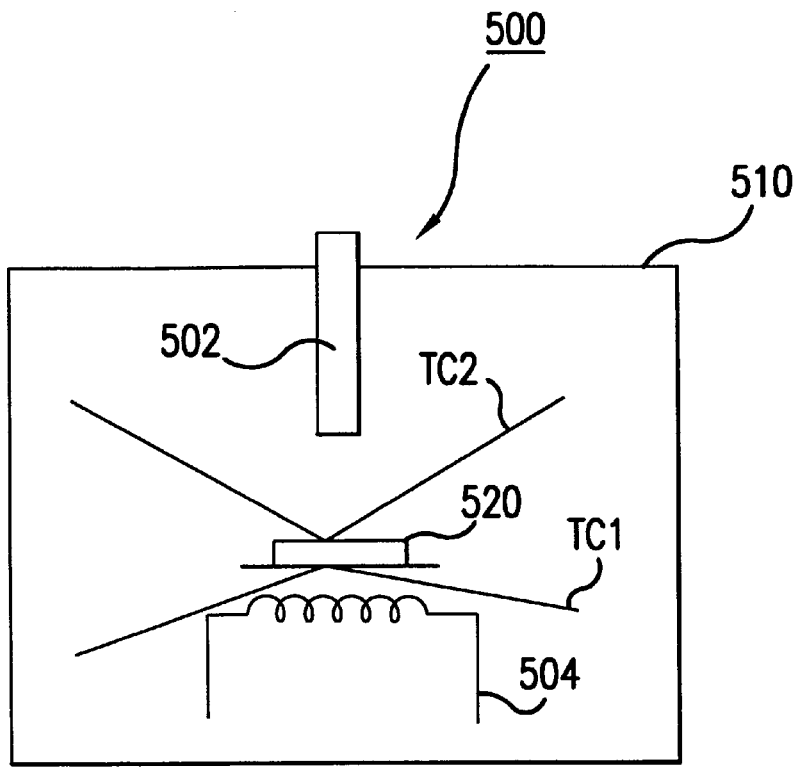
FIG. 9 is a schematic view of an apparatus for measuring thermal desorption spectra.

A measurement of the insulating film according to a thermal desorption spectrum (TDS) method will be described. This measurement was performed using a thermal-desorption-spectrum-measuring device 500 shown in FIG. 9.

This thermal-desorption-spectrum-measuring device 500 includes a quadrupole mass-spectrometer 502 and an infrared heater 504 in a vacuum chamber 510. A sample 520 is heated by the infrared heater 504 from the back of the sample 520 and the gas derived from the sample 520 is measured by the quadrupole mass-spectrometer 502 to obtain a thermal desorption spectrum. For controlling the temperature of the sample 520, a thermocouple TC1 disposed on the back surface of the sample 520 was used in view of problems related to controllability. In addition, a thermocouple TC2 is also provided on the front surface of the sample 520 in order to measure the surface temperature of the sample 520. Because the quartz substrate 522 used in the sample 520 was inferior in thermal conductivity and was as thick as 1.1 mm, there was a difference between the temperatures of thermocouples TC1 and TC2. However, it has been confirmed that the temperature in an actual process for manufacturing the MIM nonlinear device, the temperature is substantially equal to the temperature at the thermocouple TC2. For TDS measurement, a quartz glass was used for the substrate. This increases the heat resistant temperature of the substrate in order to measure the temperature until it reaches a high temperature of 1000° C. In addition, the voltage-current characteristic of the MIM nonlinear device is the same even if the substrate is replaced with an ordinary non-alkali glass.

Figure 10:
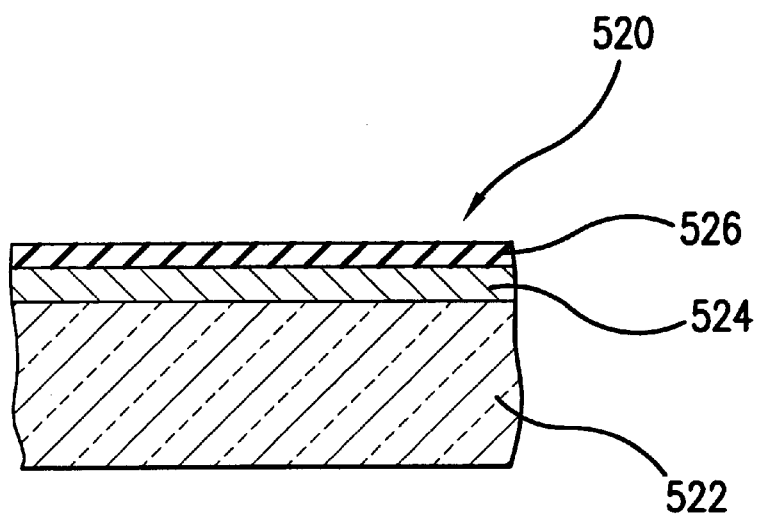
FIG. 10 is a schematic view of a sample for measuring thermal desorption spectra.

As shown in FIG. 10, in the sample 520 used for measurement, a tantalum film (containing 0.2 atomic % of tungsten) was formed on a quartz substrate 522 having a thickness of 150 mm by sputtering to a thickness of 1.1 mm, and the insulating film 526 having a thickness of approximately 85 nm was formed by anodic oxidation under the conditions described above. The thus-obtained laminated body was removed from the heat treating furnace and subjected to thermal desorption spectrum measurement as a sample 520. In addition, with respect to the TDS measurement, in order to make the data results clear, the thickness of the insulating film is large compared to the actual examples and comparative examples.

Figure 11:
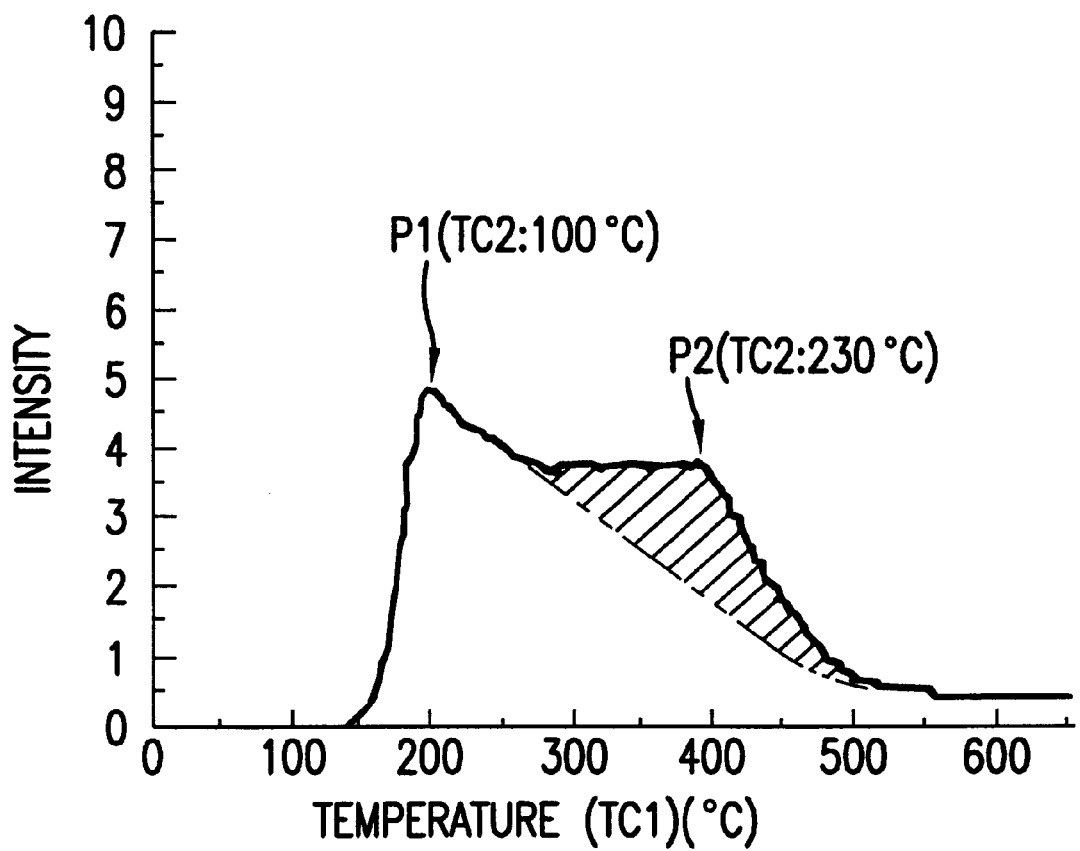
FIG. 11 is a diagram showing the thermal desorption spectrum of water for the insulating film in the MIM nonlinear device according to Example 1 of the present invention.

A thermal desorption spectrum of the sample 520 was measured and the results are shown in FIG. 11. In FIG. 11, the horizontal axis is the temperature, that is, the temperature of the controlling thermocouple TC1, and the vertical axis is the measured-value intensity of the gas at a mass of 18 ($H_2O$) corresponding to water. In the spectrum shown in FIG. 11, there are peak P1 and peak P2. As described above, the temperature of the thermocouple TC1 was different from that of the thermocouple TC2, so when the surface temperature of the sample 520 was obtained, the temperature of peak P1 according to the thermocouple TC2 was approximately 100° and the temperature at peak P2 according to the thermocouple TC2 was approximately 230°. Furthermore, the number of water molecules was calculated to be $8.2 \times 10^{14}/cm^2$ according to the integrated intensity in the peak P2 region (the part shown by diagonal lines) of FIG. 11. Further, the number of water molecules according to the integrated intensity in the peak, specifically, it was obtained by calculating the spectrum difference between the spectrum in which the peak P2 did not hypothetically exist and the measurement data shown in FIG. 11.

COMPARATIVE EXAMPLE 1

Figure 14:
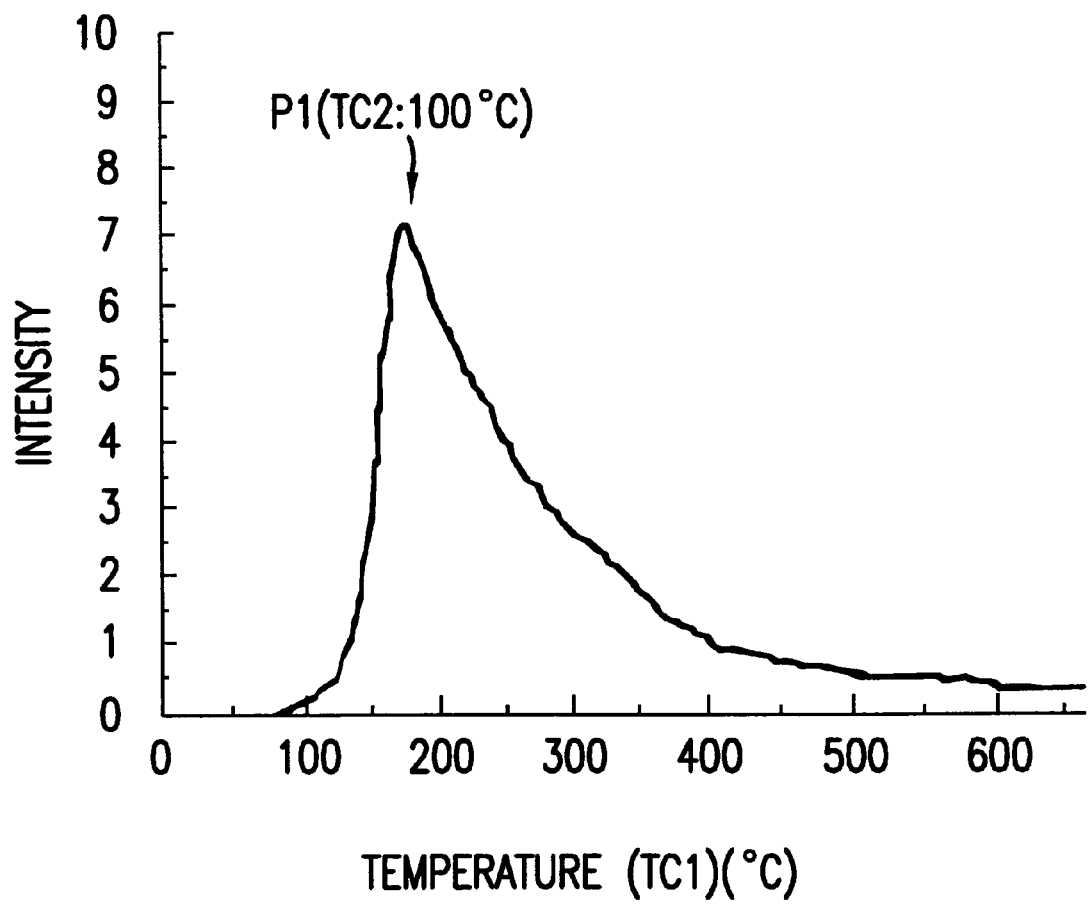
FIG. 14 is a diagram showing the water desorption spectrum for the insulating film in the MIM nonlinear device according to Comparative Example 1.

In addition, citric acid solution was used as the electrolyte for comparison, and the thermal desorption spectrum was measured by forming a sample corresponding to Comparative Example 1 in which the annealing processing was not performed. The results are shown in FIG. 14. In the spectrum of FIG. 14, the peak P2 was not observed. From FIGS. 11 and 14, it is considered that peak P1 is due to water which was physically adsorbed into the surface of the sample.

EXAMPLES 2 AND 3

Figure 12:
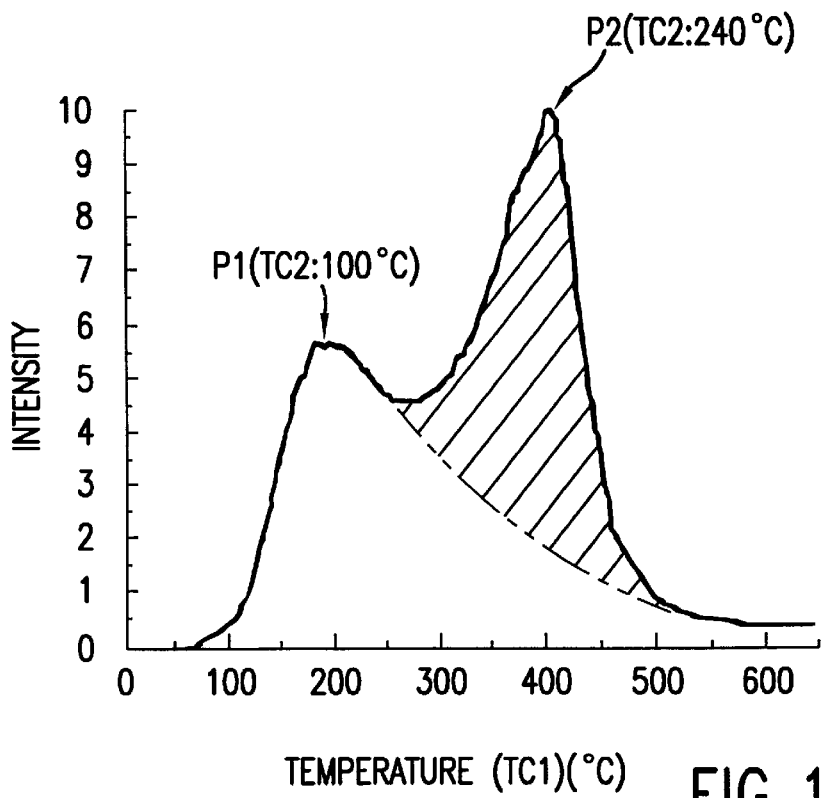
FIG. 12 is a diagram showing the thermal desorption spectrum of water obtained for the insulating film in the MIM nonlinear device according to Example 2 of the present invention.
Figure 13:
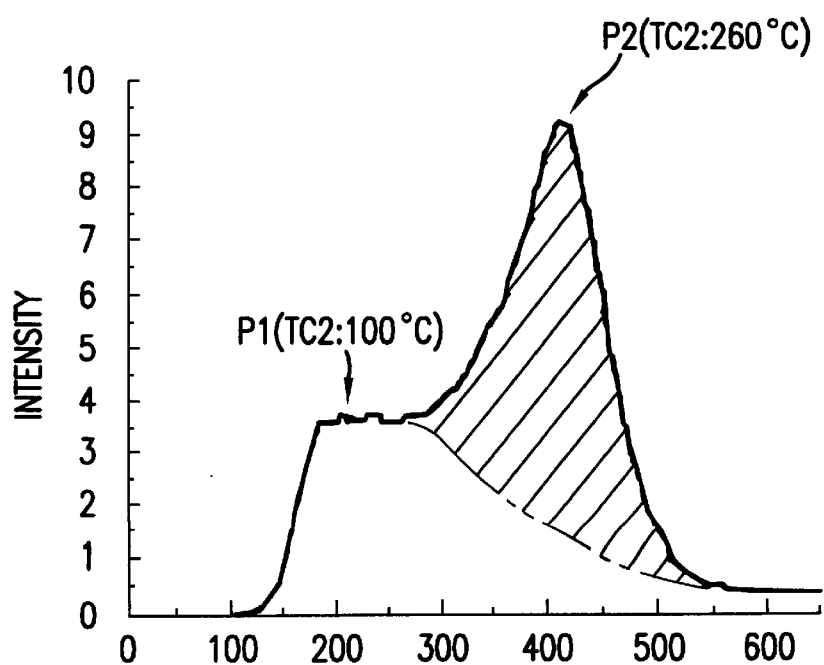
FIG. 13 is a diagram showing the thermal desorption spectrum of water for the insulating film in the MIM nonlinear device according to Example 3 of the present invention.

As in Example 1, samples were formed for Examples 2 and 3 and the respective thermal desorption spectra were obtained. Furthermore, after forming the insulating film, annealing A and B were performed on the samples used for Examples 1 and 3 at the conditions described above, and the processing to incorporate water into the insulating film was added. The thermal desorption spectra of Examples 2 and 3 are shown in FIGS. 12 and 13, respectively. In these spectra, as in Example 1, it is clear that peaks P1 and P2 appear and that water is incorporated into the insulating film. Moreover, as in Example 1, the number of water was calculated according to the integrated intensity in the peak region (the part shown by diagonal lines). The results are shown in Table 1. Furthermore, the integrated intensity of the peak P2 is the same when the TDS measurement is performed with respect to an MIM nonlinear device formed by a method the same as Examples 2 and 3 other than changing the film thickness of the insulating film.

(b) SIMS

EXAMPLES 2 AND 3 AND COMPARATIVE EXAMPLE 1

Figure 15:
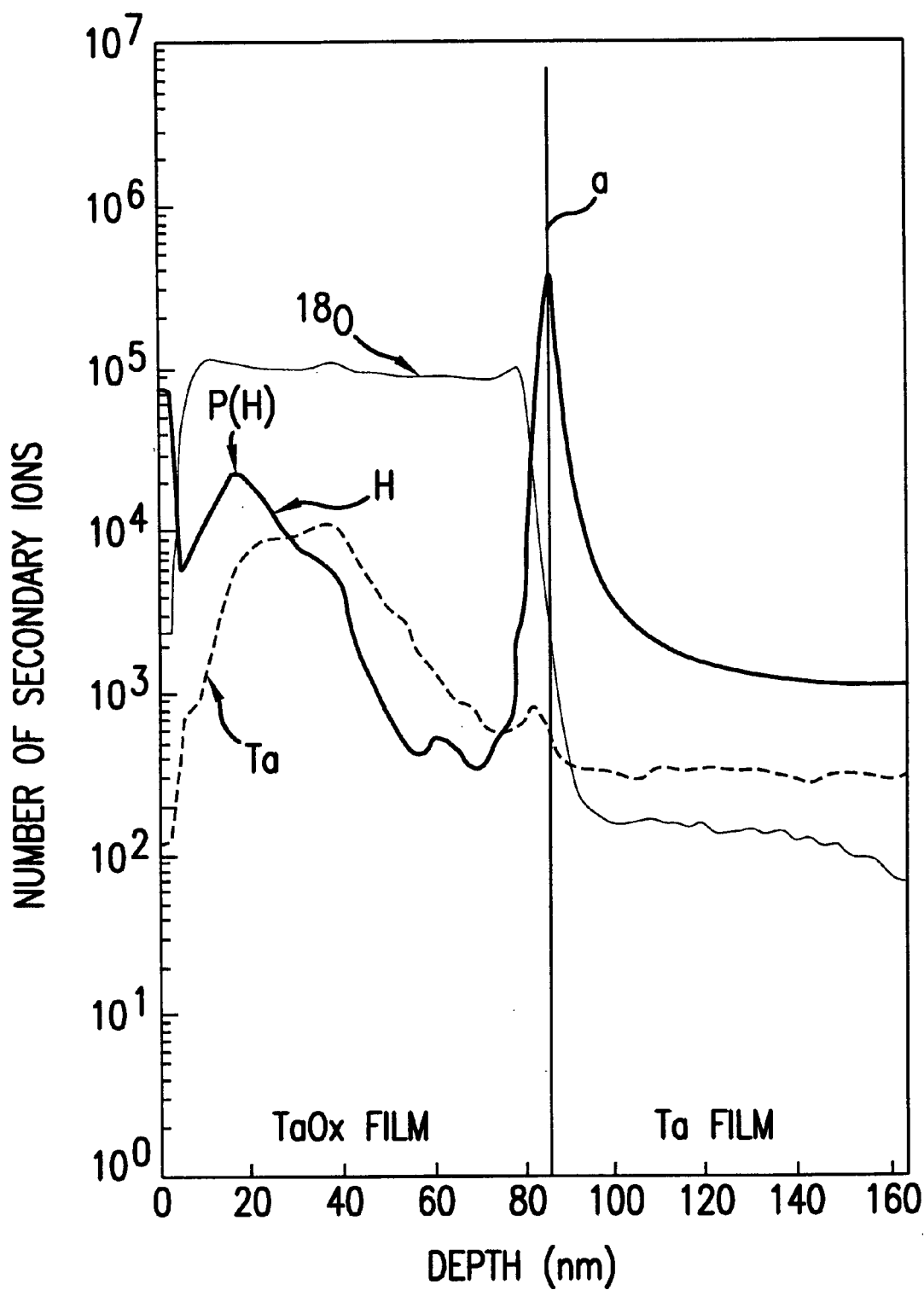
FIG. 15 is a diagram showing the SIMS spectrum obtained for the MIM nonlinear device according to Example 2 of the present invention.
Figure 16:
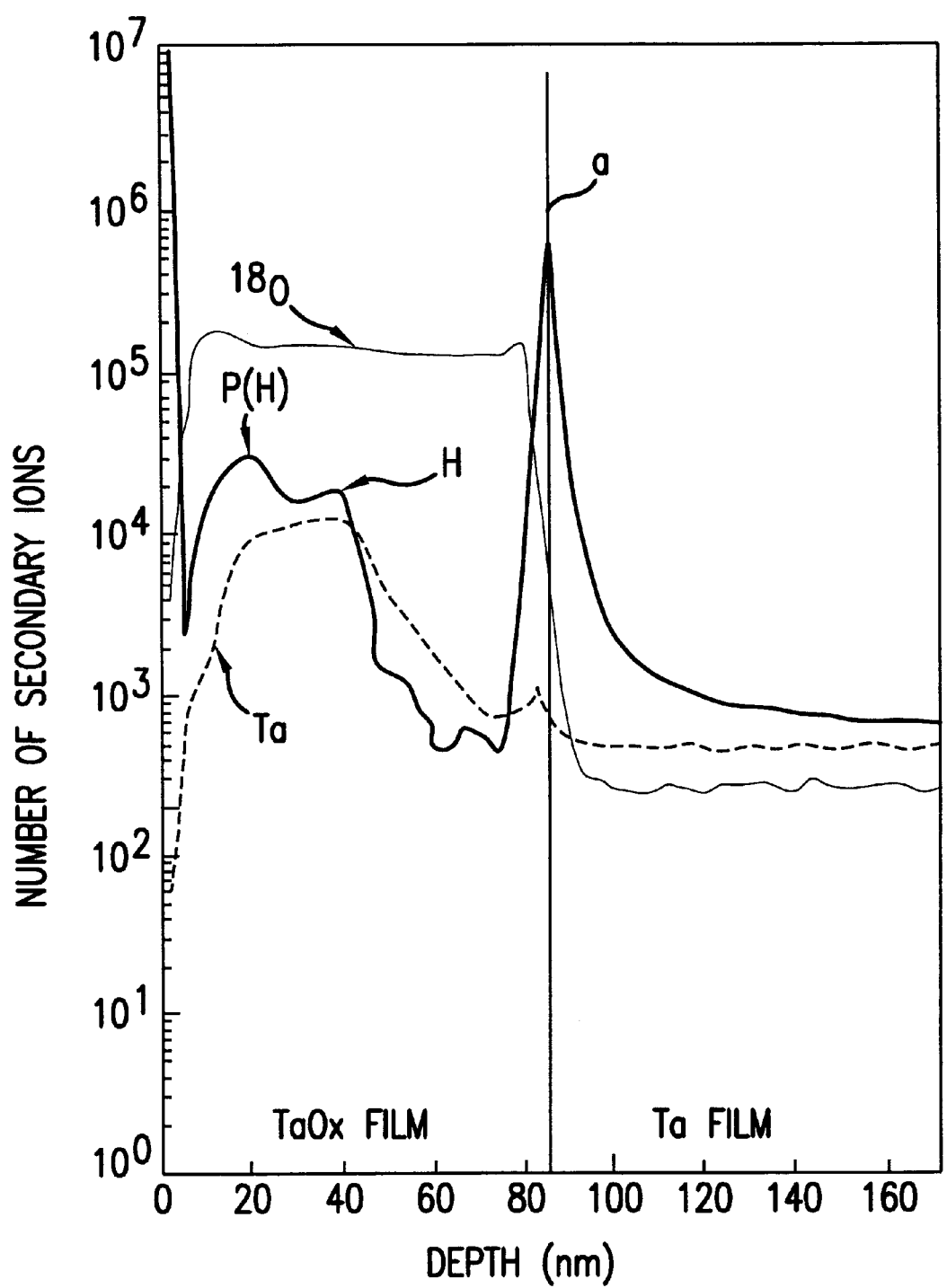
FIG. 16 is a diagram showing the SIMS spectrum obtained for the MIM nonlinear device according to Example 3 of the present invention.
Figure 17:
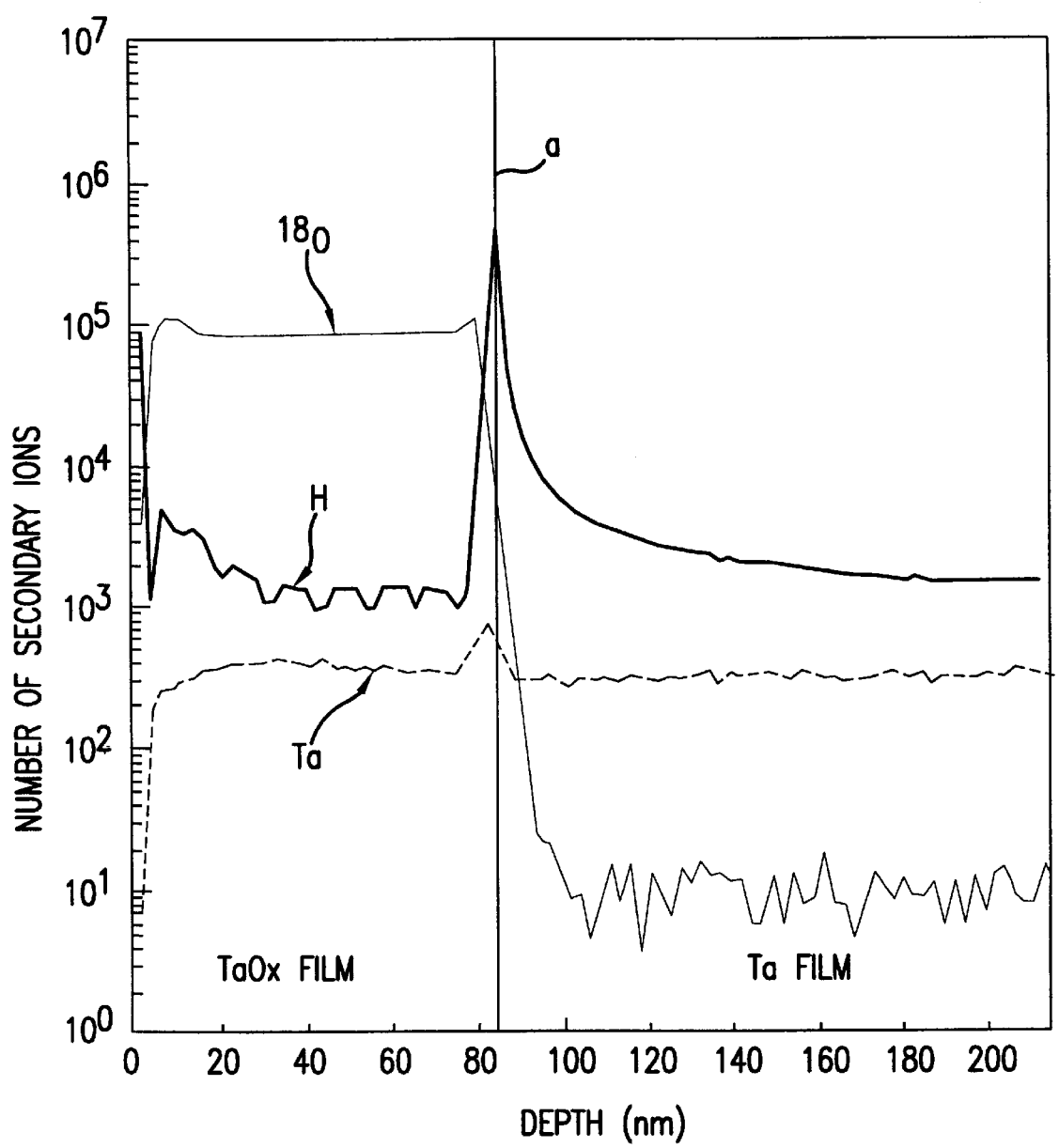
FIG. 17 is a diagram showing the SIMS spectrum obtained for the MIM nonlinear device according to Comparative Example 1.

In order to obtain the profiles of various atoms in the insulating film and the first conductive film, the results of SIMS by cesium ion etching for Examples 2 and 3 and Comparative Example 1 are shown in FIGS. 15–17, respectively. In these figures, the horizontal axis indicates the depth of each portion in the insulating film surface in the first conductive film and the insulating film, and the vertical axis indicates the logarithm of the count of secondary ions. Furthermore, in FIGS. 15–17, the line shown by symbol "a" passes through the peak of the hydrogen spectrum and shows the boundary between the first conductive film and the insulating film. Moreover, in the measurement of SIMS, as in TDS measurement, in order to easily observe the hydrogen profiles of the insulating film, the film thickness of the insulating film was approximately 85 nm.

In Examples 2 and 3 in which annealing A was performed, in the hydrogen spectrum there is a peak in the vicinity of the surface of the insulating film (second insulating film side). Because this hydrogen spectrum appears as the combined state of the hydrogen derived from hydrogen atoms and the hydrogen derived from the water, it cannot be confirmed that it shows hydrogen derived from the water of the insulating film. However, by comparing with the hydrogen spectrum of Comparative Example 1, which does not contain water in the insulating film, shown in FIG. 17, and it can be understood that the peak in the vicinity of the surface of the insulating film (second insulating film side) is due to the water in the insulating film.

That is, from FIGS. 15 and 16, hydrogen derived from the water was contained in the insulating film (TaOX film) and its spectrum has at least one peak near the surface of the insulating film (second conductive film side), and the count of secondary ions gradually decreases in the direction of the thickness of the insulating film.

According to the results of the thermal desorption spectrum (TDS) and SIMS, the following can be said. First, according to the TDS results, since no film-thickness dependency was recognized in the integrated intensity of the peak P2, water is locally incorporated in a portion of the insulating film. Further, as seen from the SIMS spectrum shown in FIGS. 15 and 16, the hydrogen peak P(H) which is positioned in the insulating film closest to the surface is within 30 nm from the surface on the second conductive film side, regardless of the thickness of the insulating film and the annealing conditions. For example, when the thickness of the insulating film is 20–70 nm and the temperature for annealing B is 300–410° C., the peak P(H) is at a depth of 10–20 nm from the surface facing the second conductive film.

Thus, according to the TDS and SIMS data, water is incorporated into the insulating film during anodic oxidation and the annealing A, and the water is localized in the insulating film portion closest to the second conductive film. Therefore, if the thickness of the insulating film is sufficiently thicker from the position where the peak P(H) of the hydrogen spectrum derived from water appears, for example, if the insulating film is thicker than 20 nm, a water-containing area (first layer) and a region without water (second layer) are generated in the insulating film, and a state exists in which insulating layers of different characteristics are joined. Here, a region without water is defined as a small area of one peak or more in which the hydrogen spectrum by SIMS derived from water is one peak or more relative to the value of the peak P(H) in terms of the secondary ion count.

(c) Nonlinearity coefficient (β value)

The voltage-current characteristic of each MIM nonlinear device of Examples 1–3 and Comparative Example 1 was examined and the nonlinearity coefficients (β value) representing the sharpness was calculated. The results are shown in Table 1.

As seen in Table 1, the β value becomes large relative to the increase in the number of water molecules contained in the insulating film. This may be because when the content of water in the insulating film increases, the energy difference between the conductive segments of the water-containing first layer and the non-water-containing second layer becomes large. The resistance of the MIM nonlinear device becomes large when low voltage is applied to the device, and the β value becomes large as a result.

(d) Resistance Characteristics

Figure 18:
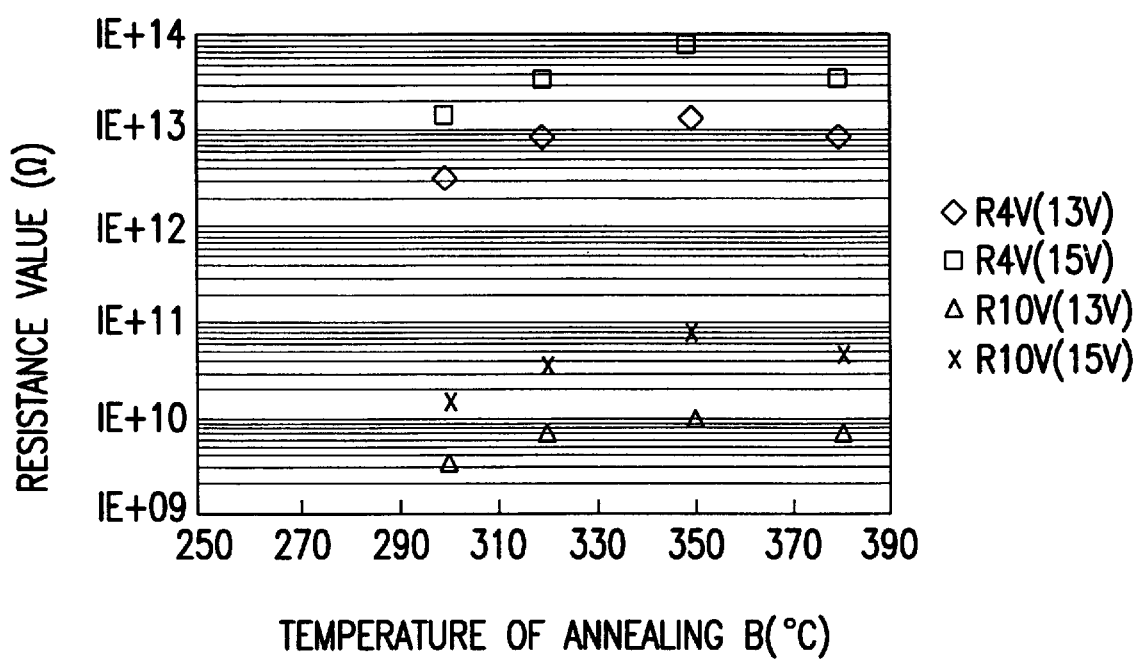
FIG. 18 is a diagram showing the relationship between the temperature of annealing B and the resistance value of the device obtained for an embodiment of the present invention.

Next, the following experiment was performed in order to examine the relationship between the heat treatment (annealing) temperature and the resistance value of the MIM nonlinear device. Eight types of samples were formed as in Example 2, other than changing the temperature T2 of the annealing B and the voltage of anodic oxidation. With respect to these samples, the respective resistances were obtained when 4V and 10V of voltage was applied to the device. The results are shown in FIG. 18. In FIG. 18, the horizontal axis indicates the temperature of the annealing B and the vertical axis indicates the resistance value of the device. Furthermore, "R4V" and "R10V" indicate that 4V and 10V of voltage were applied to the device, (13V) and (15V) indicate the respective voltages during the anodic oxidation.

According to FIG. 18, between the temperature T2 of the annealing B and the resistance value of the device, even if the resistance value changes due to the applied voltage, the same trend can be seen relative to each charge voltage. Moreover, the resistance value does not significantly change relative to the same charge voltage in a fairly wide annealing temperature range.

(e) Drift value

Next, in order to observe the relationship between the temperature T2 of the annealing B and the drift value, the following experiment was performed. "Drift value" is a value indicating the change over time of the voltage-current characteristic in a state in which the current is applied to the MIM nonlinear device. Specifically, this drift value measures the current-voltage curve twice with respect to the MIM nonlinear device of the sample, and it is defined as the difference ΔV=V2−V1 of the voltages of V1 (first measurement value) and V2 (second measurement value) at a current value of 1×10—10A.

Figure 19:
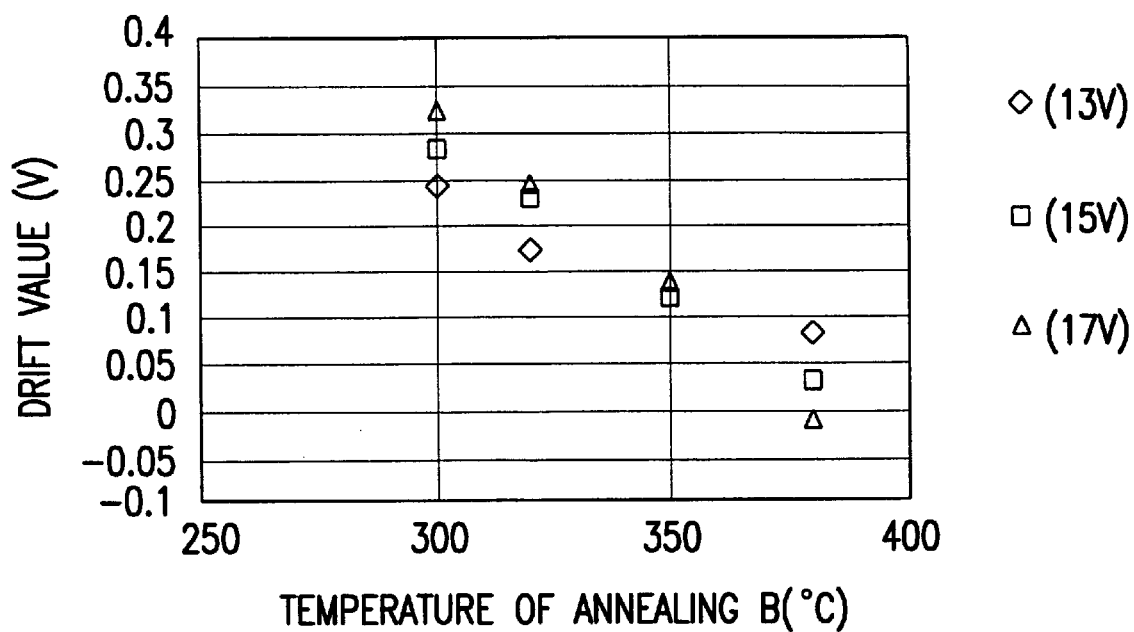
FIG. 19 is a diagram showing the relationship between the temperature of annealing B and the drift value obtained for an embodiment of the present invention.

In this experiment, the same sample as in (d) resistance value characteristic which was described above was used, and the respective drift values were obtained when the voltage applied to the device was changed to 13V, 15V, and 17V. In FIG. 19, the horizontal axis indicates the temperature T2 of the annealing B and the vertical axis indicates the drift value. According to FIG. 19, a virtually linear correlation exists between the annealing temperature and the drift value. Therefore, by selecting the range of the annealing temperature, the drift value may be controlled. Practically, if the drift value is preferably −0.2−+0.2, then the annealing temperature is preferable between approximately 320 and 380°.

(f) Shift value

Next, in order to obtain the relationship between the temperature T2 of the annealing B and the shift value, the following experiment was performed. "Shift value" is a value indicating the change of the voltage-current characteristic in a state where alternating current is applied to the MIM nonlinear device. Specifically, this shift value can be defined as the value Is by the following formula when a rectangular wave voltage which changes polarity every second is applied to the MIM nonlinear device. At this time, the applied voltage is set so that the current flows at $1 \times 1^{-7}$A per pixel of the liquid crystal display panel.

$P=\{(I10-I0)/I0\}100$ (%)

In this formula, IO indicates the absolute value of the initial (one second) current value, and I 100 indicates the absolute value of the current value after 100 seconds.

In the experiment, the same sample used for the experiment of the (d) resistance value characteristic described above was used, and the respective shift values were obtained when the applied voltage was changed to 13V, 15V, and 17V.

Figure 20:
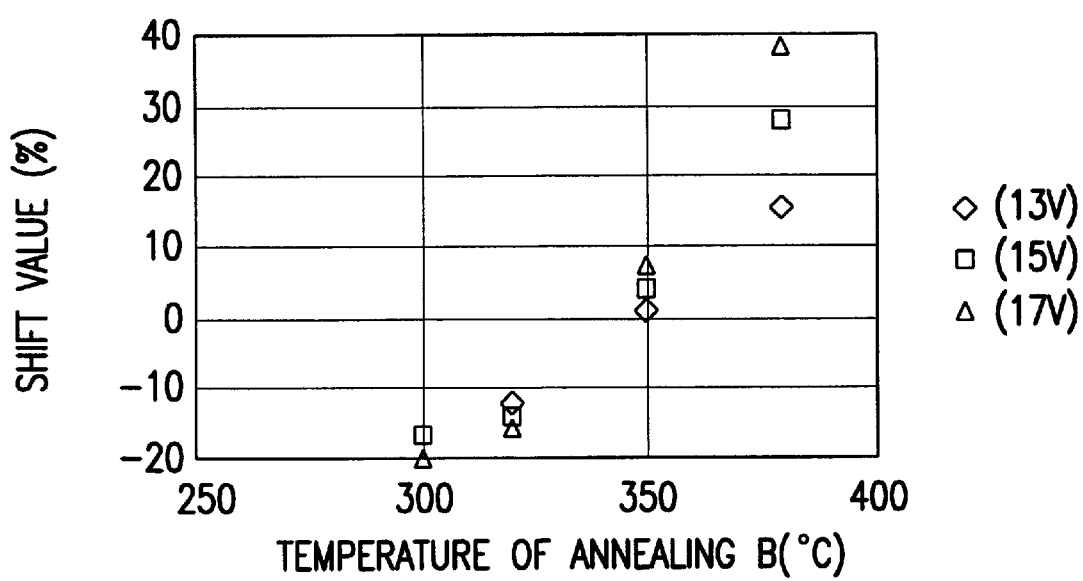
FIG. 20 is a diagram showing the relationship between the temperature of annealing B and the shift value obtained for an embodiment of the present invention.

According to FIG. 20, if the shift value is preferably −15—+15%, more preferably −1—+10%, and more preferably −2—+2%, it is preferable that the annealing temperature is selected in the range of 320–380° C.

According to the measurement result of the drift value and shift value, the temperature of the annealing B after formation of the insulating film is preferably 320–380° C., and more preferably around 350°. In addition, from Table 1, according to the example of the present invention, by introducing water into the insulating film, the 1 value is significantly improved. Moreover, by performing the heat treatment (annealing B, A) after forming the insulating film, the β value is further improved. Moreover, by comparing Example 1 with Example 2, the number of water molecules contained in the insulating film increases due to the heat treatment. Furthermore, as the temperature of the annealing B increases, the temperature of the peak P2 increases.

TABLE 1

|  | Annealing Conditions | | | Peak | No. of | |
| --- | --- | --- | --- | --- | --- | --- |
|  | Temp. (° C.) | Atmosphere | Water Vapor (Mol %) | P2 Temp. (° C.) | Water Molecules (no./cm²) | β Value |
| Practical Example 1 | — | — | — | 230 | 8.2E14 | 5.0 |
| Practical Example 2 | 320 | Air | 1.2 | 240 | 3.6E15 | 6.3 |
| Practical Example 3 | 410 | Air | 1.2 | 260 | 3.6E15 | 6.5 |
| Comparative Example 1 | — | — | — | — |  | 3.0 |

Furthermore, when a liquid crystal display panel was manufactured using the MIM nonlinear device of Example 2, a contrast of 100 or more in the temperature range of −80° C. was obtained without any display irregularities.

Possibility of Industrial Use

The present invention is appropriate for use as a two-terminal nonlinear device used as a switching device of a liquid crystal display panel, and it is also effective as a liquid crystal display panel using the two-terminal nonlinear device. Further, the present invention can be used as a manufacturing method of the two-terminal nonlinear device.

What is claimed is:

1. A two-terminal nonlinear device comprising:

a first conductive film, an insulating film, and a second conductive film on a substrate;

water being contained in said insulating film; and in a thermal desorption spectrum of said insulating film, a peak derived from the water in said insulating film is within a range of 225°–300° C.

2. The two-terminal nonlinear device as set forth in claim 1, a number of molecules calculated from the area of a peak derived from said water being $5 \times 10^{14}/cm^2$ or greater.

3. The two-terminal nonlinear device as set forth in claim 1, an intensity of a hydrogen spectrum derived from said water based upon a secondary-ion mass-spectrometry analysis (SIMS) by irradiation of cesium ion changes at least one peak in said insulating film.

4. The two-terminal nonlinear device as set forth in claim 1, said first conductive film including tantalum or a tantalum alloy.

5. The two-terminal nonlinear device as set forth in claim 4, said insulating film being an anodic oxidation of said first conductive film.

6. The two-terminal nonlinear device as set forth in claim 1, said insulating film being an anodic oxidation of said first conductive film.

7. A liquid crystal display panel comprising:

a first substrate having a transparent substrate, a signal line formed on said transparent substrate based upon a specified pattern, a two-terminal nonlinear device as set forth in claim 1 connected to said signal line, a pixel electrode connected to said two-terminal nonlinear device; a second substrate provided with another signal line disposed in a position opposite to said pixel electrode; and a liquid crystal layer between said first and second substrates.

8. The liquid crystal display panel as set forth in claim 7, a number of molecules calculated from the area of a peak derived from said water being $5 \times 10^{14}/cm^2$ or greater.

9. The liquid crystal display panel as set forth in claim 7, an intensity of a hydrogen spectrum derived from said water based upon a secondary-ion mass-spectrometry analysis (SIMS) by irradiation of cesium ion changes at least one peak in said insulating film.

10. The liquid crystal display panel as set forth in claim 7, said first conductive film including tantalum or a tantalum alloy.

11. The liquid crystal display panel as set forth in claim 7, said insulating film being an anodic oxidation of said first conductive film.

* * * * *